United States Patent
DiCaprio et al.

(10) Patent No.: US 6,624,005 B1
(45) Date of Patent: Sep. 23, 2003

(54) SEMICONDUCTOR MEMORY CARDS AND METHOD OF MAKING SAME

(75) Inventors: Vincent DiCaprio, Mesa, AZ (US); Kenneth Kaskoun, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/656,253

(22) Filed: Sep. 6, 2000

(51) Int. Cl.$^7$ .............................................. H01L 21/56
(52) U.S. Cl. ...................................................... 438/113
(58) Field of Search ................................. 438/106, 127, 438/126, 977, 113, 118, FOR 374; 257/679; 264/272.17

(56) References Cited

U.S. PATENT DOCUMENTS

| | | | |
|---|---|---|---|
| 4,530,152 A | 7/1985 | Roche et al. ................. | 29/588 |
| 4,649,418 A | 3/1987 | Uden ......................... | 357/80 |
| 4,674,175 A * | 6/1987 | Stampfli ..................... | 29/588 |
| 5,200,362 A | 4/1993 | Lin et al. .................... | 437/207 |
| 5,216,278 A | 6/1993 | Lin et al. .................... | 257/688 |
| 5,241,133 A | 8/1993 | Mullen, III et al. ....... | 174/52.4 |
| 5,291,061 A | 3/1994 | Ball ........................... | 257/686 |
| 5,474,958 A | 12/1995 | Djennas et al. ............ | 437/211 |
| 5,612,513 A | 3/1997 | Tuttle et al. ................ | 174/260 |
| 5,620,928 A | 4/1997 | Lee et al. ................... | 438/118 |
| 5,662,262 A * | 9/1997 | McMahon et al. ......... | 228/56.3 |
| 5,700,981 A | 12/1997 | Tuttle et al. ................ | 174/250 |
| 5,776,798 A * | 7/1998 | Quan et al. ................. | 438/112 |
| 5,815,372 A | 9/1998 | Gallas ........................ | 361/760 |
| 5,880,904 A * | 3/1999 | Mizoshita et al. ....... | 360/97.01 |
| 5,894,108 A | 4/1999 | Mostafazadeh et al. .... | 174/52.4 |
| 5,937,512 A * | 8/1999 | Lake et al. ................. | 156/233 |
| 5,976,912 A | 11/1999 | Fukutomi et al. .......... | 438/110 |
| 5,981,314 A * | 11/1999 | Glenn et al. ............... | 438/127 |
| 5,990,545 A | 11/1999 | Schueller et al. .......... | 257/697 |
| 5,998,860 A * | 12/1999 | Chan et al. ................. | 257/679 |
| 6,001,671 A | 12/1999 | Fjelstad .................... | 438/112 |
| 6,031,278 A * | 2/2000 | Onoda et al. ............... | 257/679 |
| RE36,613 E | 3/2000 | Ball ........................... | 257/777 |
| 6,060,778 A | 5/2000 | Jeong et al. ................ | 257/710 |
| 6,087,202 A * | 7/2000 | Exposito et al. ............ | 438/113 |
| 6,110,755 A * | 8/2000 | Muramatsu et al. ........ | 438/106 |
| 6,172,419 B1 | 1/2001 | Kinsman .................... | 257/737 |
| 6,304,306 B1 * | 10/2001 | Shiomi et al. ............... | 349/88 |
| 6,309,943 B1 * | 10/2001 | Glenn et al. ................ | 438/113 |
| 2002/0031869 A1 * | 3/2002 | Minamio et al. ........... | 438/127 |

FOREIGN PATENT DOCUMENTS

JP        62-9639       1/1987

* cited by examiner

*Primary Examiner*—George Fourson
*Assistant Examiner*—Suk San Foong
(74) *Attorney, Agent, or Firm*—Bever, Hoffman & Harms, LLP; James E. Parsons

(57) ABSTRACT

Alternative methods for making memory cards for computers and such eliminate a need for a separate external housing and a separate chip encapsulation step and enable more memory to be packaged in a same-sized card. One of said methods includes providing a substrate having opposite first and second surfaces with a memory chip mounted on and in electrical connection with a first surface of said substrate. Said second surface of said substrate is temporarily attached to a first surface of a flat carrier sheet, e.g., an adhesive tape. In one embodiment, a mold having a cavity therein is placed on said first surface of said carrier sheet such that said chip and said first surface of said substrate are enclosed in said cavity between said mold and said carrier sheet. A fluid plastic is introduced into said cavity and cured to encapsulate said chip and at least said first surface of said substrate in a protective, monolithic body of hardened plastic. A completed card is then detached from said carrier sheet.

3 Claims, 5 Drawing Sheets

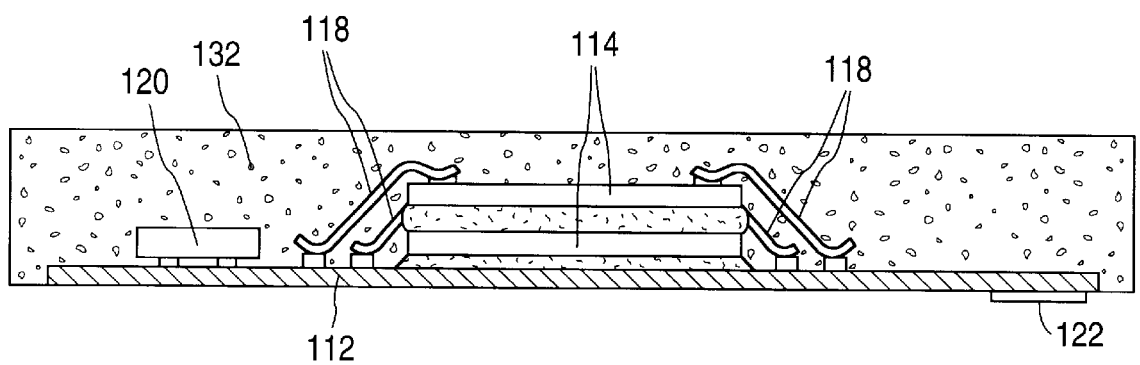
Fig. 13
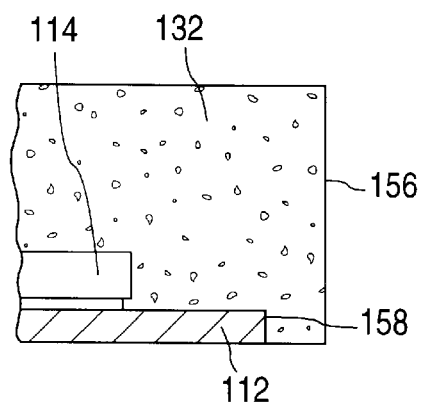 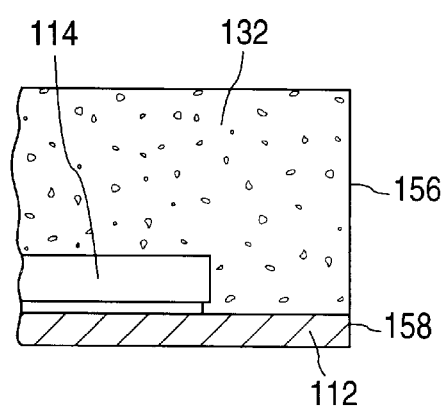
Fig. 14   Fig. 15

SEMICONDUCTOR MEMORY CARDS AND METHOD OF MAKING SAME

BACKGROUND

1. Technical Field

This invention relates to packaging memory cards, such as flash or ROM memory cards.

2. Related Art

A recent global spate of portable electronic devices such as computers, electronic toys, PDAs, cameras, smart phones, digital recorders, pagers, and such has spawned a concomitant need for compact, removable data storage components. One response to this demand has been development of so-called "memory cards." Typically, a memory card contains at least one or more semiconductor memory chips within a standardized enclosure that has connectors thereon for electrical connection to external circuitry. Examples of these include so-called "PC Cards" and "MultiMediaCards" made in accordance with standards promulgated by such trade associations as Personal Computer Memory Card International Association ("PCMCIA") and MultiMediaCard Association ("MMCA"), respectively.

An exemplary embodiment of such a memory card, namely, a Multimedia-Card 10, is illustrated in top plan, cross-sectional side elevation, and bottom plan views of FIGS. 1–3, respectively. Card 10 illustrated has standardized dimensions of 32 mm long X 24 mm wide X 1.4 mm thick, and typically includes a memory capacity of 2 to 32 megabits ("MB") of memory, which is accessed through seven contacts 22 located on a bottom surface of card 10 using, e.g., a standard serial port interface ("SPI") interface. A simple chamfer 30 on one corner of card 10 prevents incorrect insertion of card 10 into a connector in a host device.

Memory card 10 comprises a rectangular substrate 12, such as a printed circuit board ("PCB"), and one or more semiconductor memory dies or "chips" 14 mounted on and electrically connected thereto using, e.g., a layer 16 of adhesive and conventional wire bonds 18, respectively. Surface mounting passive components 20, e.g., resistors, may also be mounted on and connected to substrate 12. Contacts 22 are connected through substrate 12 to memory circuits defined by foregoing components and serve as input-output terminals of card 10.

When components 14, 20 have been mounted on and connected to substrate 12, chip 14 is protectively encapsulated by a "glob-topping" process. A glob 24 of a viscous encapsulant is dispensed onto a top surface of chip 14, allowed to flow over its sides to said surface of substrate 12, and cured to form a protective envelope over chip 14. An external cover or housing 26 (shown by dotted outline in FIG. 1) of thin sheet metal or plastic is installed over substrate 12 assembly by embedding said top surface of assembly in a bed 28 of an adhesive contained in housing 26.

While said foregoing method provides a useable memory product, it is always desirable in a rapidly evolving market such as this to develop new fabrication methods that simplify a product, reduce its costs, and enhance its functionality.

BRIEF SUMMARY

This invention provides methods for making a memory card, e.g., a MultiMediaCard, that eliminate a need for an external housing and a separate encapsulation step, and that enables more memory to be packaged in a same size of card.

In one of said methods, a substrate having opposite first and second surfaces is provided. A memory die, or chip, is mounted on and electrically connected to said first surface of said substrate, e.g., by wire bonding. Said second surface of said substrate is attached to a first surface of a flat carrier sheet, e.g., an adhesive tape. In one embodiment, a mold is placed on said first surface of said carrier sheet such that said chip and said first surface of said substrate are enclosed in a cavity defined by said mold and said carrier sheet. Said chip and said first surface of said substrate are encapsulated in a monolithic body of hardened plastic, e.g., by injecting a fluid plastic, such as a filled liquid epoxy resin, into said cavity and curing said resin to harden same. Completed cards are then detached from said carrier sheet for use.

Said methods eliminate a need for an external housing on said card and a separate chip encapsulation step. These enable a reduction in card height, or incorporation of more memory chips in a card with a standardized height using diestacking techniques. Said methods are well adapted to volume production techniques.

A better understanding of above and other features and advantages of this invention may be had from a consideration of a detailed description below of some exemplary embodiments thereof, particularly if such consideration is made in conjunction with appended drawings.

DESCRIPTION OF DRAWINGS

FIG. 13 is a cross-sectional side elevation view into a memory card having two stacked chips in accordance with one embodiment of this invention;

FIG. 14 is an enlarged partial cross-sectional elevation view into said memory card shown in FIG. 4, as revealed by a cross-section taken therein along lines XIV—XIV; and, FIG. 15 is an enlarged partial cross-sectional elevation view into one of said memory cards shown in FIG. 12, as revealed by a cross-section taken therein along lines XV—XV.

DETAILED DESCRIPTION

Figure 1:
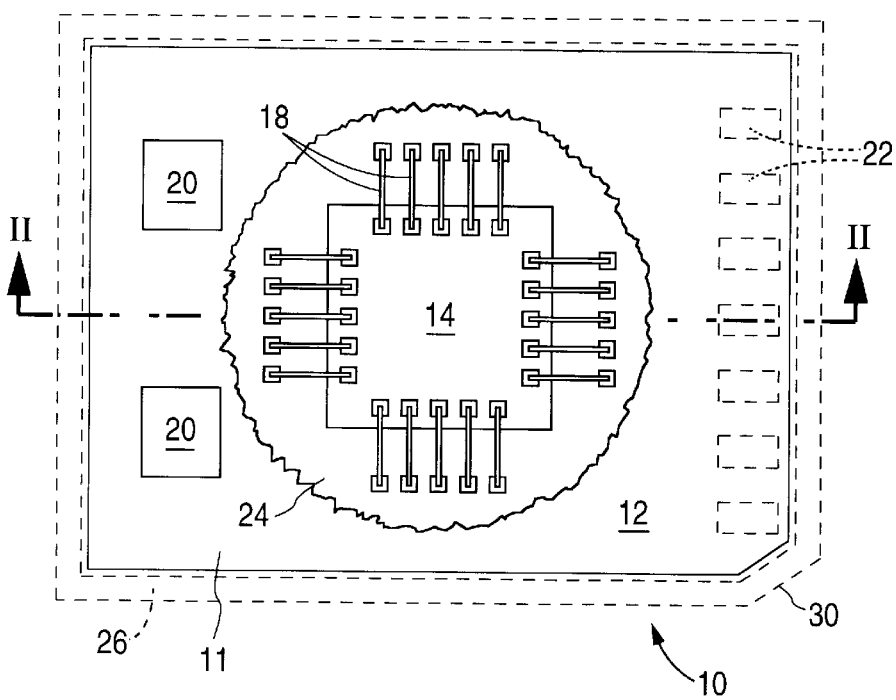
FIG. 1 is top plan view of a prior art memory card, with separate external housing shown in dotted outline to reveal card details.
Figure 4:
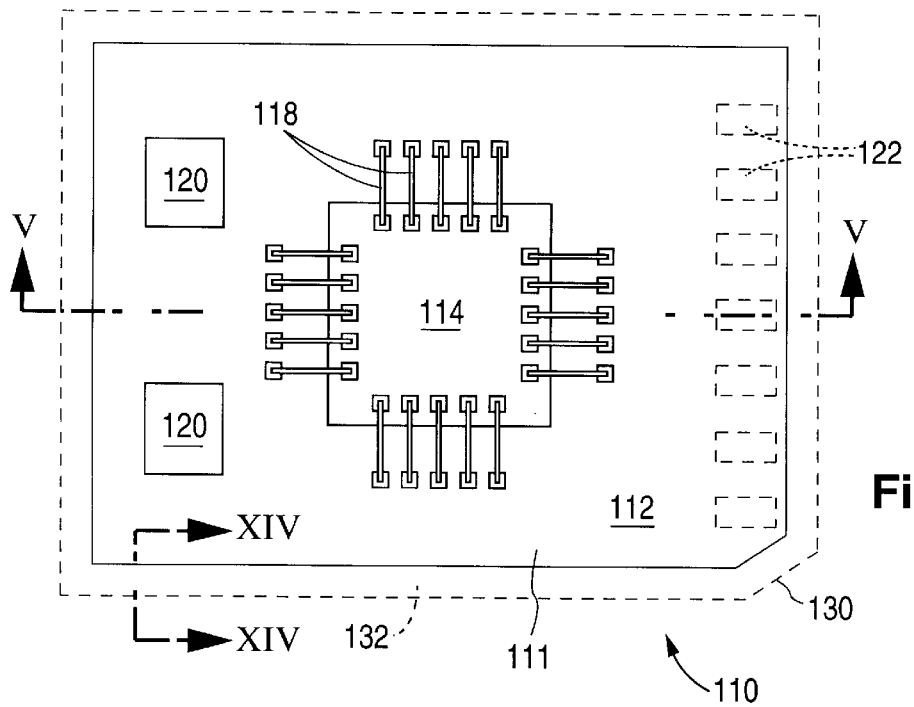
FIG. 4 is a top plan view of an exemplary embodiment of a memory card made in accordance with a method of this invention.
Figure 5:
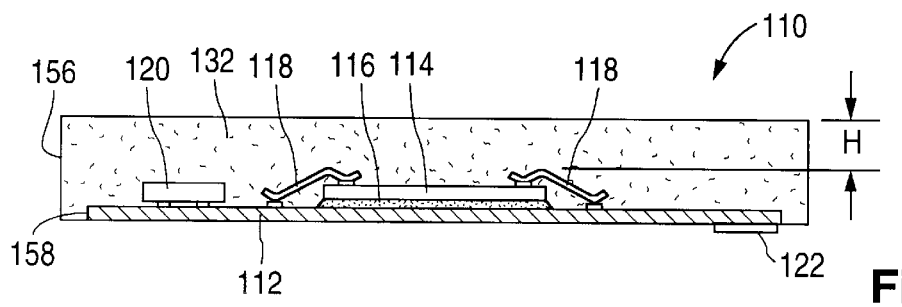
FIG. 5 is a cross-sectional side elevation view into said card shown in FIG. 4, as revealed by a cross-section taken therein along lines V—V.
Figure 6:
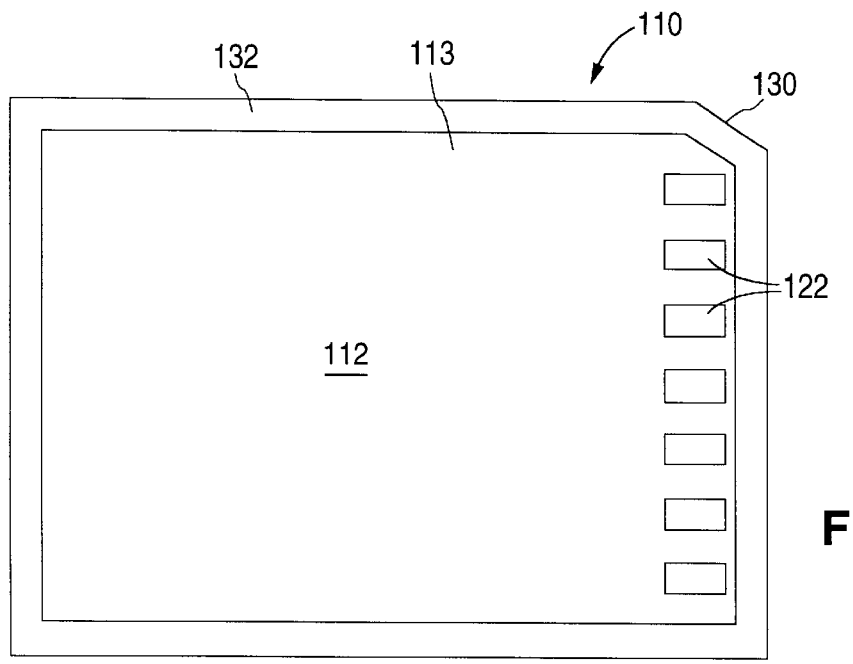
FIG. 6 is a bottom plan view of said card shown in FIGS. 4 and 5.

A memory card 110 made in accordance with one exemplary embodiment of methods of this invention is illustrated in top plan, cross-sectional side elevation, and bottom plan views of FIGS. 4–6, respectively. In FIG. 1, a "mold cap," or hardened plastic body 132 encapsulating electronic components 114 and 120 and top surface of substrate 112 is shown in dotted outline to reveal underlying detail. Cross-sectional elevation view into card 110 of FIG. 5 is produced by taking a section in FIG. 4 along lines V—V. Top plan views of two alternative embodiments of memory card 110 at various stages in its production are shown in FIGS. 7–9, and 10–12, respectively.

Figure 2:
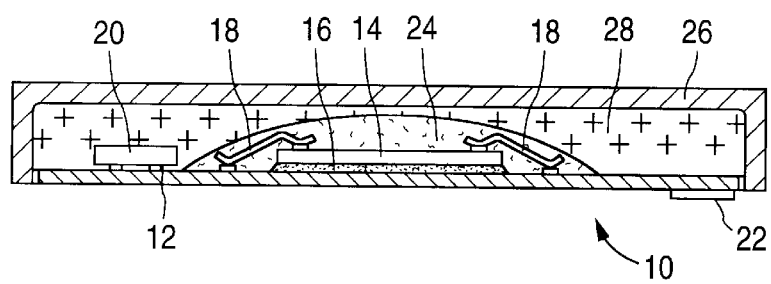
FIG. 2 is a cross-sectional side elevation view into said conventional card shown in FIG. 1, as revealed by a cross-section taken therein along lines II—II.
Figure 3:
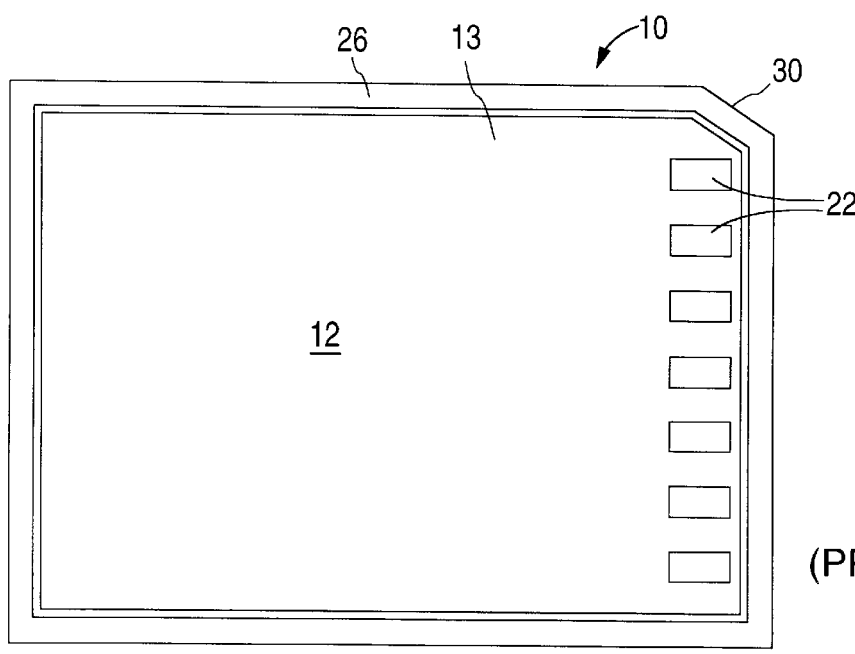
FIG. 3 is a bottom plan view of said prior art card shown in FIGS. 1 and 2.

As may be seen by reference to FIGS. 4–6, memory card 110 is identical in size and contains elements similar to those of prior art memory card 10 illustrated in FIGS. 1–3. Similar elements in card 110 are referenced by similar reference numbers, plus 100. Novel card 110 comprises a rectangular substrate 112, e.g., a PCB, having respective first and second surfaces 111 and 113 and a semiconductor memory chip 114 mounted on and electrically connected on first surface 111. Chip 114 is mounted on first surface 111 of substrate 112 with a layer 116 of adhesive and electrically connected to said first surface with conventional wire bonds 118. Particular contents of memory card 110 and configuration of external contacts 122 may vary depending on particular application. For example, a plurality of memory chips and passive components may be used, or passive components may be omitted, or memory management chips may be included, among other possibilities. Again, certain industry standards apply in certain cases.

In another possible embodiment (not illustrated) chip 114 may be mounted on and electrically connected to first surface 111 of substrate 112 using well known "flip chip," or "C4" method of die-to-substrate attachment. In such mounting, it may be desirable to underfill a narrow space between chip 114 and first surface 111 of substrate 112 with a solid insulative material, e.g., a hardened epoxy resin, in a known manner. Surface mounting passive components 120, e.g., resistors, may also be mounted on and electrically connected to first surface 111 of substrate 112. As in prior art memory card 10, input-output contacts 122 are located at an edge of bottom surface 113 of card 110, and a chamfer 130 is provided on one corner thereof for one-way-only insertion of card into a host device connector.

However, comparing novel card 110 shown in FIGS. 4–6 with prior art card 10 shown in FIGS. 1–3 also reveals some important differences. For example, thin metal or plastic external housing 26, bed 28 of adhesive, and glob-top encapsulation 24 over chip 14 of prior art card 10 are replaced in novel card 110 by a single hardened plastic body 132 which more effectively encapsulates electronic components 114 and 120, and respective first surface 111 and side walls 158 of substrate 112. Moreover, replacement of such former elements and manufacturing processes related thereto by said single latter element and encapsualtion process frees up additional space H (see FIG. 5) in card 110 above chip 114, namely, about 0.3 mm. This space can be used e.g., to mount additional components. For example, as shown in FIG. 13, a second memory chip 114 can be mounted on top of first-mounted memory chip 114 above and electrically connected to first surface 111 of substrate 112 using die-stacking techniques disclosed in, e.g., U.S. application Ser. No. 09/536,574, filed 03/28/2000, and assigned to an assignee hereof. This increases memory capacity of card 110 while retaining said same, standard form factor.

Said methods for making memory card 110 shown in FIGS. 4–6, as described below in connection with FIGS. 7–9, and 10–12, respectively, are readily adapted to simultaneous production of a number of cards in an elongated strip form. However, such methods are easily extended to manufacture of a single memory card 110, or alternatively, to simultaneous production of a rectangular array thereof (not illustrated), e.g., a 4×4 array of memory cards 110.

Figure 7:
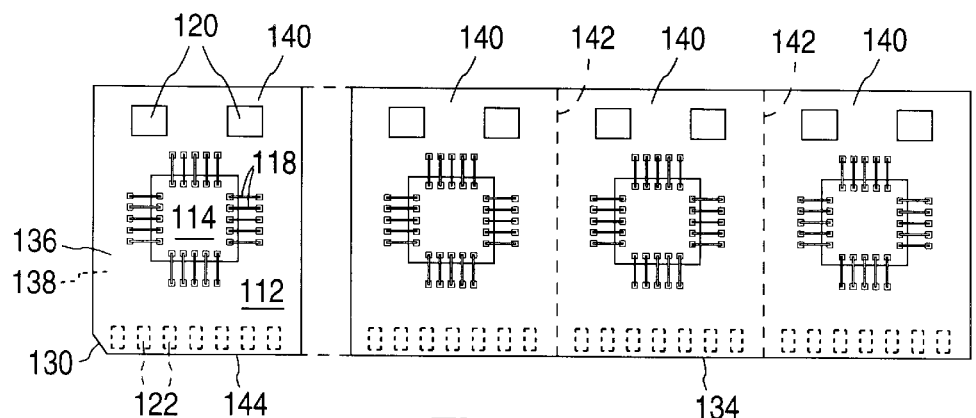
FIG. 7 is a top plan view of a plurality of memory card subassemblies connected together in a strip form during fabrication and before being encapsulated in accordance with a method of this invention.

Thus, one method includes providing a continuous substrate strip 134 having opposite first and second surfaces 136, 138 and a plurality of individual chip-mounting sites 140 on said first surface thereof (see FIG. 7). A memory chip 114 and additional passive components 120, if any, are mounted on and electrically connected to first surface 136 of strip substrate 134 in corresponding ones of mounting sites 140, as described above. Alternatively, a plurality of memory chips and passive devices, or one or more memory devices and no passive devices, may be mounted on first surface 136 of strip substrate 134. Numbers and types of memory chips and passive components are application specific, and not limiting of this invention.

Figure 8:
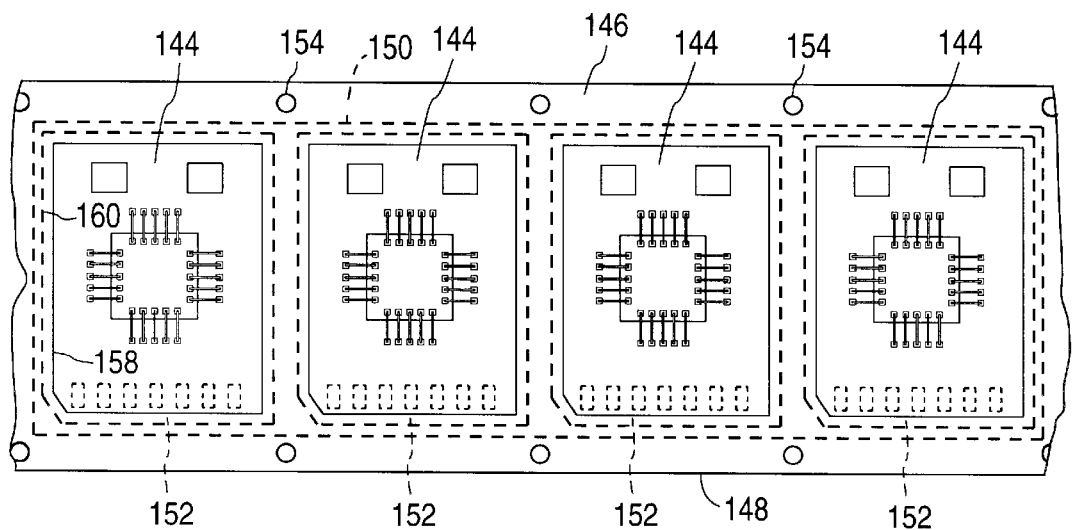
FIG. 8 is a top plan view of said plurality of memory card subassemblies shown in FIG. 7 attached to an elongated carrier sheet after being separated and during encapsulation in accordance with a method of this invention.

As illustrated in FIG. 7, after electronic components 114 and 120 are mounted on and electrically connected to corresponding ones of mounting sites 140 on first surface 136 of strip substrate 134, substrate 134 is cut along dotted lines 142 to divide assembled strip 134 into a plurality of individual substrate assemblies 144, each having a corresponding individual substrate 112. Respective second surfaces 138 of each individual substrate assembly 144 are temporarily attached to a first surface 146 of a flat carrier sheet 148 (see FIG. 8) such that individual assemblies 144 are attached to carrier sheet 148 in a spaced-apart relationship, as shown in FIG. 8. Carrier sheet 148 may be a plastic film with an adhesive thereon, or a polyimide film with an adhesive thereon.

Substrate assemblies 144 can be temporarily attached to carrier sheet 148 with a "tacky," i.e., partially cured, adhesive. It is desirable that said adhesive form a seal between opposing second surfaces 138 of individual substrate assemblies 144 and first surface 146 of carrier sheet 148 to prevent encapsulant from entering between said opposing surfaces during an encapsulation procedure. Said adhesive may be of a known type that is initially tacky but which loses adhesion when exposed to ultraviolet ("U.V.") light. In such an embodiment, subsequent detachment of parts from carrier sheet 148 comprises exposing said adhesive to ultraviolet light and lifting said parts away from sheet 148.

Figure 9:
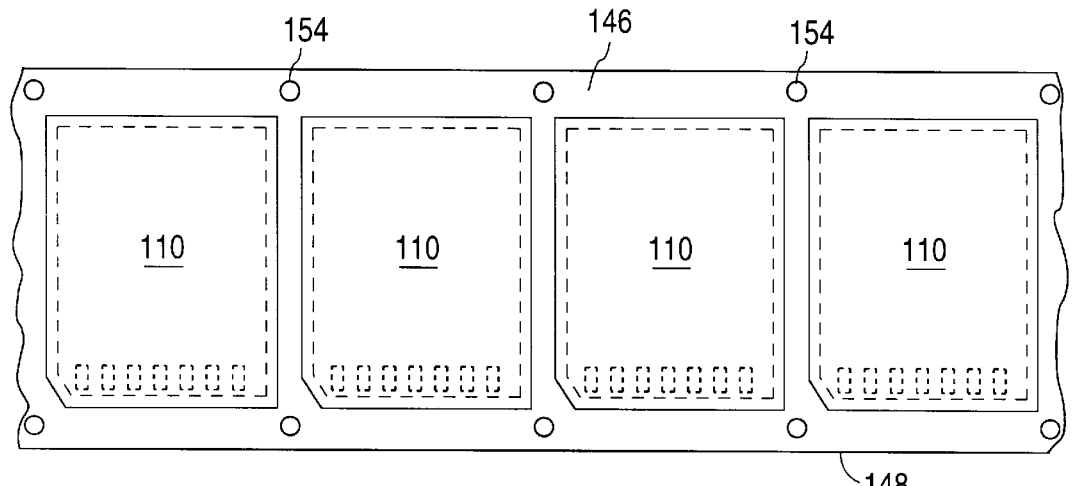
FIG. 9 is a top plan view of said plurality of memory cards subassemblies shown in FIG. 8 after being encapsulated.
Figure 10:
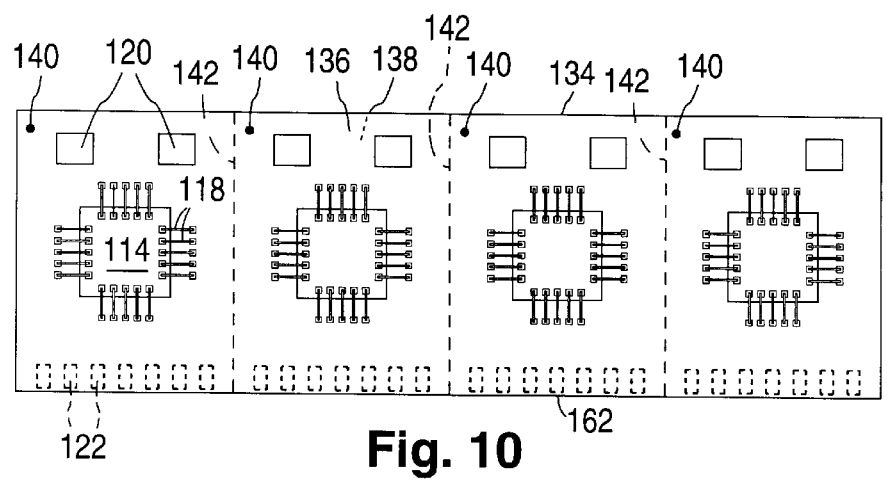
FIG. 10 is a top plan view of a plurality of memory card subassemblies connected together in a strip form during fabrication and before being encapsulated in accordance with another method of this invention.

When substrate assemblies 144 are attached to carrier sheet 148, each of chips 114, corresponding wire bonds 118, and corresponding chip-mounting sites 140 are encapsulated in a monolithic body 132 of hardened plastic (see FIGS. 4–6). This can be effected in a number of different ways. As shown in FIG. 8, a mold 150 (shown by dashed outline) having a plurality of cavities 152 therein is placed on first surface 146 of carrier sheet 148 such that each individual substrate assembly 144 is enclosed in a separate corresponding cavity 152 between mold 150 and carrier sheet 148. Carrier sheet 148 may be provided with a plurality of tooling holes 154 for appropriate relative alignment of substrate assemblies 144 with mold cavities 152. Cavities 152 are each filled with a fluid plastic, e.g., an epoxy resin, and said resin is cured to harden same. When encapsulation is complete, mold 150 is removed from carrier sheet 148 to leave a plurality of completed memory cards 110 attached thereto, as shown in FIG. 9. Completed memory cards 110 are then detached from carrier sheet 148 for, e.g., post-encapsulation testing and packaging.

It may be noted in FIGS. 4–6 that side walls 156 of plastic body 132 are spaced outside of corresponding side walls 158 of respective individual substrates 112 (see enlarged section of FIG. 14), which results from interior side walls 160 of mold cavities 152 being positioned outside of side walls 158 of respective individual substrates 112 during encapsulation (see FIG. 8). However, in other possible embodiments, one or more of corresponding respective side walls 156 and 158 of plastic body 132 and respective individual substrates 112 may be coplanar, as shown in FIG. 15 and described in more detail below.

Figure 11:
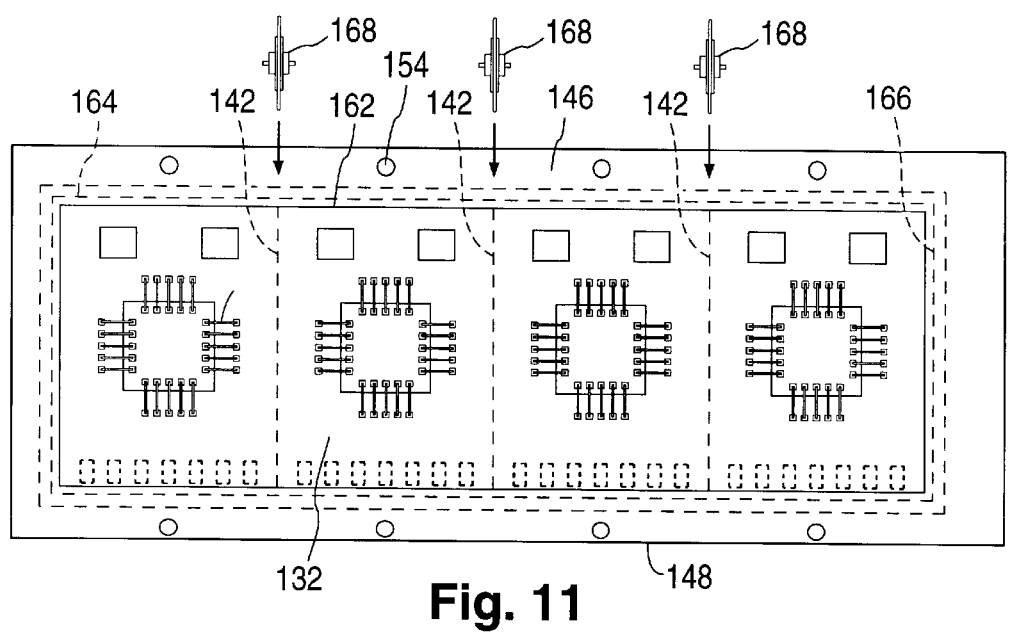
FIG. 11 is a top plan view of said plurality of memory card subassemblies shown in FIG. 10 attached to an elongated carrier sheet after being separated and during encapsulation in accordance with a method of this invention.
Figure 12:
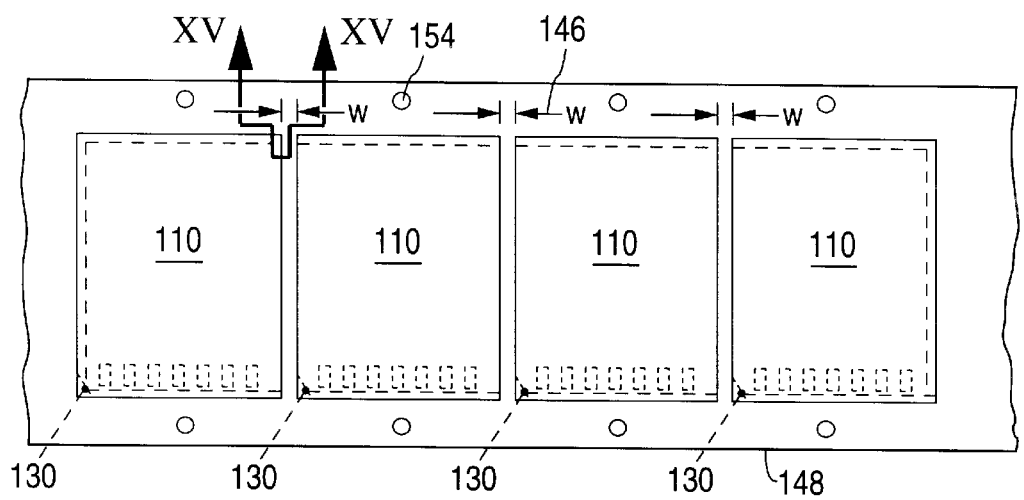
FIG. 12 is a top plan view of said plurality of memory cards subassemblies shown in FIG. 11 after being encapsulated and singulated.

In an alternative embodiment illustrated in FIGS. 10–12, a memory chip 114 and additional passive components 120, if any, are mounted on and electrically connected to first surface 136 of strip substrate 134 in corresponding ones of chip-mounting sites 140, as described above, to form a single strip assembly 162 (FIG. 10). However, strip substrate 134 is not divided into individual assemblies, as above. Instead, second surface 138 of undivided strip assembly 162 is then attached to first surface 146 of carrier sheet 148, and memory chips 114, passive components 120, and at least first surface 136 of strip assembly 162 are encapsulated in a single monolithic body 132 of hardened plastic, as follows.

As shown in FIG. 11, a mold 164 having a single cavity therein is placed on first surface 146 of carrier sheet 148 such that at least first surface 136 of substrate strip assembly 162, including chips 114 and passive components 120, are enclosed in cavity 166 between mold 164 and carrier sheet 148. Cavity 166 is then filled with a fluid plastic, and said plastic is hardened into a single-piece plastic body 132 (see FIG. 11).

When plastic body 132 is hardened, mold 164 is removed from carrier sheet 148, and plastic body 132 and underlying strip substrate 134 are cut through with, e.g., a saw 168 along cutting lines 142, i.e., perpendicular to a long side of strip substrate assembly 162, to define a plurality of individual memory cards 110 attached to carrier sheet 148 and separated from each other by a width W of said cut (see FIG. 12).

In yet another possible embodiment (not illustrated), strip substrate assembly 162 can be encapsulated in a single-piece body of encapsulant and then cut into individual memory cards 110 using apparatus and methods described in U.S. Pat. No. 5,981,314 to T. P. Glenn, et al., which is incorporated herein in its entirety by this reference.

It may be noted that in embodiments requiring cutting, plastic body 132 and/or strip substrate 134 can be precisely sawed through downwards from a top surface of plastic body 132 to, but not through, carrier sheet 148, with currently available semiconductor wafer sawing equipment, and that such cutting procedure simultaneously forms copla-nar side walls 156 and 158 on both severed plastic body 132 and severed substrate 112 of each memory card 110 where such sawing has taken place, as shown enlarged in FIG. 15. It may be further noted that, if a one-way keying chamfer 130 is not molded into each memory card 110 during encapsulation, as illustrated in FIG. 9, chamfer 130 can be precisely sawed into an appropriate corner of each card 110 after cards 110 are separated from carrier sheet 148.

As will be apparent by now to those of skill in this art, many modifications, variations, and substitutions are possible in this invention's methods and materials without departing from its spirit and scope. Accordingly, this invention's scope should not be limited by any particular embodiments illustrated and described herein, as these are merely exemplary in nature. Rather, this invention's should commensurate with that of claims appended hereafter and their substantial equivalents.

What is claimed is:

1. A method of making a plurality of memory cards, said method comprising:

providing a substrate having opposite first and second surfaces and a plurality of individual chip-mounting sites on said first surface thereof, wherein the substrate is a printed circuit board sheet with input/output terminals on the second surface of each chip mounting site thereof;

mounting a memory chip on and in electrical connection with said first surface of said substrate in a corresponding one of each of said mounting sites;

attaching said second surface of said substrate to a first surface of a carrier sheet;

encapsulating each of said memory chips and a corresponding one of said mounting sites in a body of hardened plastic;

cutting through said body and said printed circuit board sheet along a periphery of at least a portion of each of said mounting sites to define a plurality of individual memory cards on said carrier sheet, whereby the memory card so formed includes an encapsulated subportion of the printed circuit board sheet, said subportion having a substantially rectangular perimeter including at least four rectilinear side wall portions, wherein at least two of said rectilinear side wall portions are encapsulated during said encapsulation step and at least one said rectilinear side wall portion of the memory card so formed is not encapsulated and is coincident with a side of the plastic body; and, detaching said individual memory cards from said carrier sheet.

2. The method according claim 1, wherein said encapsulating comprises:

placing a mold having a cavity therein on said first surface of said carrier sheet such that said memory chips and at least said first surface of said substrate are enclosed in said cavity between said mold and said carrier sheet;

filling said cavity with a fluid plastic; and, hardening said plastic.

3. The method according to claim 1, wherein each of said individual memory cards has one or more corners, and wherein said cutting comprises cutting a chamfer on one of said corners.

* * * * *